United States Patent
Schrod et al.

(10) Patent No.: US 10,134,974 B2
(45) Date of Patent: Nov. 20, 2018

(54) METHOD FOR IDENTIFYING AN OVERCURRENT WHEN CHARGING A PIEZO ACTUATOR

(71) Applicant: CONTINENTAL AUTOMOTIVE GMBH, Hannover (DE)

(72) Inventors: Walter Schrod, Regensburg (DE); Thomas Franz, Nuremberg (DE); Christoph Haggemiller, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 5 days.

(21) Appl. No.: 15/254,134

(22) Filed: Sep. 1, 2016

(65) Prior Publication Data

US 2017/0063113 A1   Mar. 2, 2017

(30) Foreign Application Priority Data

Sep. 1, 2015 (DE) .................. 10 2015 216 663

(51) Int. Cl.
*H02J 7/00* (2006.01)
*H01L 41/04* (2006.01)

(52) U.S. Cl.
CPC ............ *H01L 41/042* (2013.01); *H02J 7/007* (2013.01); *H02J 7/0031* (2013.01); *H02J 2007/0039* (2013.01)

(58) Field of Classification Search
CPC .. H02J 7/0031; H02J 7/007; H02J 2007/0039; H01L 41/042

(Continued)

(56) References Cited

U.S. PATENT DOCUMENTS 5,097,171 A * 3/1992 Matsunaga ........ B60G 17/0185
310/316.01
6,366,868 B2 * 4/2002 Freudenberg ....... F02D 41/2096
307/113

(Continued)

FOREIGN PATENT DOCUMENTS

CN     101258657 A    9/2008
DE     19845042 A1    4/2000

(Continued)

*Primary Examiner* — Nathaniel Pelton
(74) *Attorney, Agent, or Firm* — Laurence A. Greenberg; Werner H. Stemer; Ralph E. Locher

(57) ABSTRACT

A method for identifying an overcurrent when charging a piezo actuator, by periodically connecting and disconnecting the piezo actuator to and from an energy source via a charging coil. A connection is followed by a disconnection when the charging current has reached a prescribed maximum current value and a minimum switched-on time has elapsed, and a connection is effected again when either a prescribed minimum current value has been reached or a maximum switched-off time has elapsed. An overcurrent is identified when a disconnection is effected when the minimum switched-on time has elapsed and the charging current has previously reached or exceeded a prescribed maximum current value. An overcurrent is also identified when, after a disconnection on account of the prescribed maximum current value having been reached, a connection is effected again when the maximum switched-off time has elapsed without the minimum current value having been reached.

3 Claims, 2 Drawing Sheets

(58) Field of Classification Search
USPC .......................................................... 320/134
See application file for complete search history.

(56) References Cited

U.S. PATENT DOCUMENTS

| | | | |
|---|---|---|---|
| 7,522,398 B2 | 4/2009 | Tang | |
| 8,461,794 B2* | 6/2013 | Schrod | .................. H02N 2/067 |
| | | | 318/430 |
| 2004/0169436 A1 | 9/2004 | Fukagawa et al. | |
| 2011/0181228 A1 | 7/2011 | Schrod et al. | |
| 2015/0171652 A1 | 6/2015 | Haggenmiller et al. | |
| 2017/0159534 A1* | 6/2017 | Tsutsumi | ................ F01N 11/00 |

FOREIGN PATENT DOCUMENTS

| | | |
|---|---|---|
| DE | 102008022947 A1 | 11/2009 |
| DE | 102013219609 A1 | 4/2015 |
| DE | 102014223892 A1 | 5/2015 |
| GB | 2334164 A | 8/1999 |

* cited by examiner

METHOD FOR IDENTIFYING AN OVERCURRENT WHEN CHARGING A PIEZO ACTUATOR

CROSS-REFERENCE TO RELATED APPLICATION

This application claims the priority, under 35 U.S.C. § 119, of German application DE 10 2015 216 663.5, filed Sep. 1, 2015; the prior application is herewith incorporated by reference in its entirety.

BACKGROUND OF THE INVENTION

Field of the Invention

The invention relates to a method for identifying an overcurrent when charging a piezo actuator, wherein charging is effected by periodically connecting and disconnecting the piezo actuator to and from an energy source via a charging coil.

Such a method is described in the commonly assigned patent application publication US 2015/0171652 A1 and its counterpart German published patent application DE 10 2013 219 609 A1. There is also described a corresponding circuit arrangement for performing the method.

Such a circuit arrangement will be explained with reference to FIG. 1. A first and a second piezo actuator P1, P2 can be connected to a storage capacitor C acting as an energy source via a charging coil Lm and a first switching transistor T1. In FIG. 1, the charging coil Lm and the relevant connection of the piezo actuator P1, P2 have a filter circuit, comprising a filter capacitor Cf and a filter coil Lf, connected between them, wherein the filter capacitor Cf is connected between the charging coil Lm and the reference-ground potential of the energy source C, and the filter coil Lf is connected in series between the charging coil Lm and the piezo actuators P1, P2. To discharge the piezo actuators P1, P2 and to ensure free running, the charging coil Lm and the reference-ground potential connection of the energy source C have a second switching transistor T2 arranged between them. Each of the piezo actuators P1, P2 has a selection transistor TA1, TA2 arranged in series with it.

FIG. 2 shows a typical profile for the charging current EL during correct operation of a circuit arrangement as shown in FIG. 1. As such, when the first piezo actuator P1 is completely discharged, a charging process is intended to begin at the time t0. To this end, the first selection transistor TA1, on the one hand, and the first switching transistor T1, on the other hand, are turned on by a control circuit—not shown. As a result, a current begins to flow—slowed down by the charging coil Lm—from the storage capacitor C to the first piezo actuator P1.

For current limiting, a maximum current Imax is firstly prescribed, the profile of which is shown by a dashed line in FIG. 2, but secondly a minimum switched-on time tmin is prescribed, during which the transistors T1, TA1 are intended to remain switched on. As a result, as shown in FIG. 2, a current profile for the charging current IL that reaches a first maximum when the minimum switched-on time tmin elapses is obtained in the first charging cycle, wherein the condition that the first switched-on time tmin has been reached and the maximum current value Imax has been exceeded leads to actuation of at least the first switching transistor T1, which turns off said switching transistor again.

On account of the charging coil Lm, the charging current IL continues to be maintained in the first piezo actuator P1, but continuously decreases until either a minimum prescribed current value Imin or a maximum switched-off time tmax has been reached. In the case of this first charging cycle, the first switching transistor T1 and/or the first selection transistor TA1 is/are switched on again on account of the maximum switched-off time tmax being reached, as is evident from FIG. 2, as a result of which the first switching transistor T1 and/or the first selection transistor TA1 is/are switched on again and the charging current IL begins to rise again.

This is effected for the second charging cycle in turn until the minimum switched-on time tmin is reached, and the subsequent free-running phase is also interrupted again by fresh operation of the first switching element T1 and/or of the first selection transistor TA1 on account of the maximum switched-off time tmax being reached.

In the subsequent charging cycles, the first piezo actuator P1 is disconnected from the storage capacitor C on account of the maximum value MAX_I of the maximum current value Imax being reached by the charging current IL, and the first switching transistor T1 and/or the first selection transistor TA1 is/are also first switched on not when the maximum switched-off time tmax is reached but rather already when the minimum prescribed current value Imin is reached.

This process is repeated during proper operation until the charging process for the first piezo actuator P1 is finally terminated. The maximum value MAX_I of the maximum current value Imax is denoted by a value of between approximately 10 and 20 A in FIG. 2, a fault current Idiag of approximately 30 A furthermore being shown, which, when reached in the event of a faulty overcurrent, prompts the charging process to be imperatively terminated by the control unit.

The effect of such a fault in the form of a short via the piezo actuator P1, P2 is shown in FIG. 3 and is intended to occur, after an initial profile, as corresponds to that in FIG. 2 beginning at the time t0, at a time t1. In this case, dissipation of the magnetic field in the charging coil Lm would no longer be influenced by the charging voltage across the piezo actuator, which means that the current decrease is always effected at the same speed, and would be much slower. Switching on the first switching transistor T1 again when the first piezo actuator P1 is charged would always be effected after the maximum switched-off time tmax has been reached, without the prescribed minimum current value Imin being reached.

The reason for this is that the increasing charging current would also always rise at the same rise speed, since the influence of the charging voltage for the piezo actuator would disappear in this case too and therefore the first switching transistor T1 would always be disconnected only after the minimum switched-on time tmin has been reached and not already when the maximum value MAX_I of the maximum current value Imax is reached. In this way, as shown in FIG. 3, the current would slowly escalate until it reached the fault current Idiag and emergency disconnection by the controller would be effected.

The choice of this fault current Idiag must find a compromise between robust design and costs incurred on account of the current-carrying capacity that may be required for the relevant components, however. With new PowerMOS technologies, this compromise becomes even more difficult to find, however. Owing to the design optimized for low switching losses, not only the current values reached but also the possible active and free-running phases are monitored by setting the minimum switched-on time tmin and the maximum switched-off time tmax as appropriate. Changeover on the basis of these time limits being reached is per se not a fault in the system, however, but rather a necessary operating state. Although exceeding of the fault threshold is a sufficient condition for disconnection of the system, it is in most cases too late in order to prevent internal short or to limit the currents arising.

It is therefore the object of the invention to specify a solution to the above-described problem.

SUMMARY AND DESCRIPTION OF THE INVENTION

With the foregoing and other objects in view there is provided, in order to overcome the above-mentioned and other disadvantages of the heretofore-known devices and methods of this general type, a method of identifying an overcurrent when charging a piezo actuator, the method comprising:

charging the piezo actuator by periodically connecting and disconnecting the piezo actuator to and from an energy source via a charging coil, wherein a connection is followed by a disconnection when the charging current has reached a prescribed maximum current value and a minimum switched-on time has elapsed, and a connection is once more effected when either a prescribed minimum current value has been reached or a maximum switched-off time has elapsed; and determining that an overcurrent exists if either or both of the following occurs:

a disconnection is effected when the minimum switched-on time has elapsed and the charging current has previously reached or exceeded the prescribed maximum current value; or after a disconnection due to the prescribed maximum current value having been reached, a connection is once more effected when the maximum switched-off time has elapsed but the minimum current value had not been reached.

In other words, the objects of the invention are achieved by a method as described above for identifying an overcurrent when charging a piezo actuator, wherein charging is effected by periodically connecting and disconnecting the piezo actuator to and from an energy source via a charging coil such that connection is followed by a disconnection when the charging current has reached a prescribed maximum current value and a minimum switched-on time has elapsed, and a connection is effected again when either a prescribed minimum current value has been reached or a maximum switched-off time has elapsed, involves the overcurrent being identified when a disconnection is effected when the minimum switched-on time has elapsed and the charging current has previously reached or exceeded a prescribed maximum current value or when, after a disconnection on account of the prescribed maximum current value having been reached, a connection is effected again when the maximum switched-off time has elapsed without the minimum current value having been reached.

In accordance with an added feature of the invention, an overcurrent is first identified when, successively, a disconnection is effected when the minimum switched-on time has elapsed after the charging current has reached or exceeded a prescribed maximum current value and then a connection is effected again when the maximum switched-off time has elapsed without the minimum current value having been reached.

Inventive evaluation of the different switch-on and switch-off conditions of the switching transistors of a circuit arrangement for charging a piezo actuator allows safe identification of when there is an abnormal operating state, particularly a current value that is higher than is usual in a normal operating state.

In accordance with an advantageous development of the method according to the invention, a fault is first identified when an overcurrent has been identified for a prescribed number of cycles. This allows greater robustness of the system to be achieved and false identifications to be avoided.

In a further modified mode of the invention, each identification of an overcurrent leads to an increase in a fault counter reading, and a fault is first identified when the fault counter reading reaches a prescribed value.

The fault counter reading can thus be increased when merely the maximum current value is exceeded and the minimum switched-on time is reached only subsequently and then a disconnection is effected, or can just be increased when the maximum switched-off time has elapsed without the minimum current value having been reached. In this case, the two overcurrent conditions can lead to a different increase in the fault counter reading, for example disconnection on account of the minimum switched-on time elapsing can prompt the fault counter reading to be increased by just one, while the fault counter reading is increased by two on connection when the maximum switched-off time has been reached or vice versa. For fault identification, only the fault counter reading itself is of significance, not the type of overcurrent identification.

DESCRIPTION OF THE INVENTION

Figure 1:
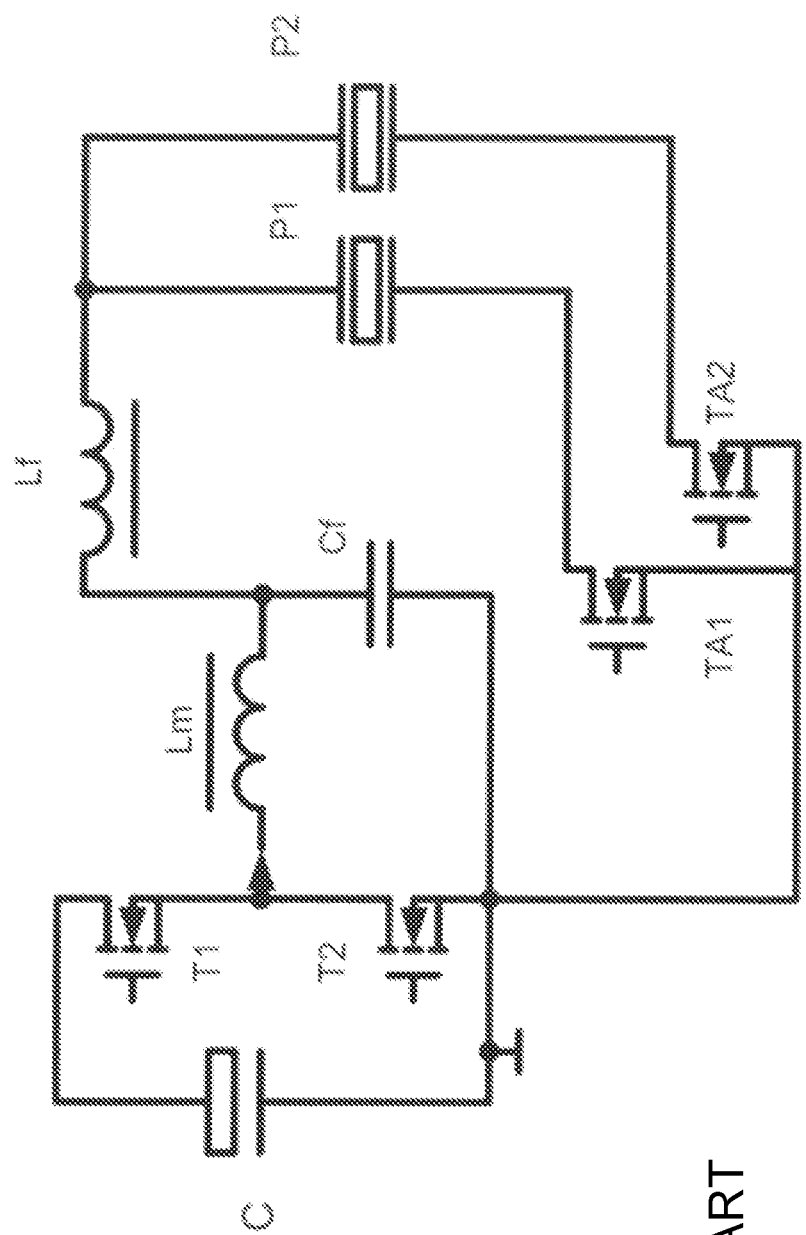
FIG. 1 is a schematic diagram representing a circuit arrangement according to the prior art for performing the method.
Figure 2:
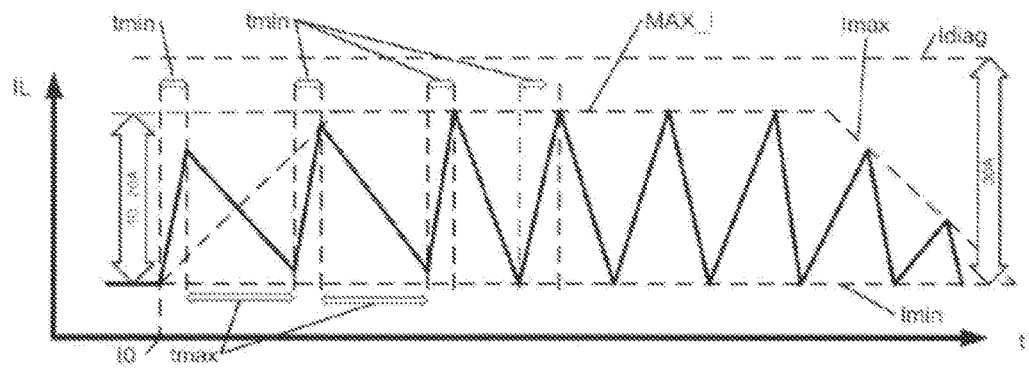
FIG. 2 is a schematic graph illustrating a typical profile for the charging current EL during the correct operation of the circuit illustrated in FIG. 1.
Figure 3:
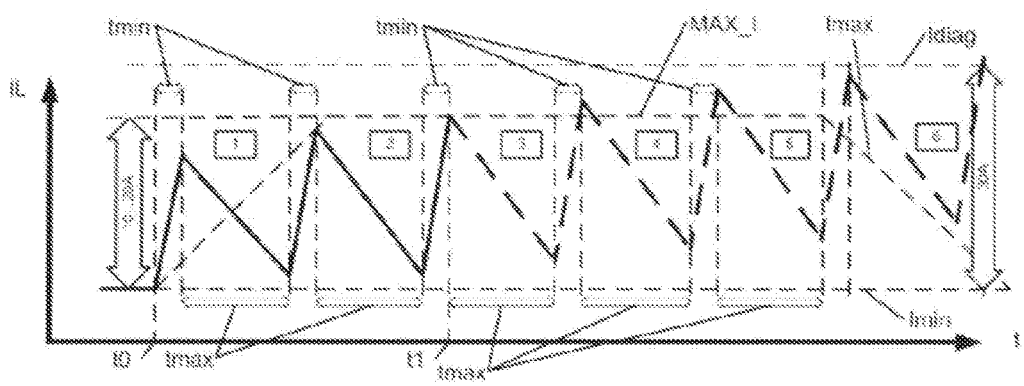
FIG. 3 is a schematic graph showing the effect of a fault in the form of a short via piezo actuators P1, P2.

In the profile of the charging current IL, as shown in FIG. 3, a short via the piezo actuator is intended to arise at the time t1, as already stated above, which satisfies the first condition that the piezo actuator is disconnected from the energy source at a time at which firstly the maximum current value Imax has been reached or exceeded and secondly the minimum switched-on time has likewise been reached or has elapsed. The second condition now likewise occurs, that the switching transistor T1 is switched on again after the maximum switched-off time tmax has been reached, without the prescribed minimum current value Imin being reached.

In the example shown, this case arises in a cycle denoted by a 3. It can clearly be seen that the same conditions likewise occur in the subsequent cycles 4, 5 and 6, and the fault current value Idiag would finally be reached in a subsequent seventh cycle.

However, the measure according to the invention means that it is already possible to decide that there is an overcurrent on account of a short, and to effect the disconnection of the system in order to prevent overheating and destruction of the components, at an earlier time, for example in the fourth or fifth cycle.

The invention claimed is:

1. A method of identifying an overcurrent when charging a piezo actuator, the method comprising:

charging the piezo actuator by periodically connecting and disconnecting the piezo actuator to and from an energy source via a charging coil, wherein a connection is followed by a disconnection when the charging current has reached a prescribed maximum current value and a minimum switched-on time has elapsed, and a connection is once more effected when either a prescribed minimum current value has been reached or a maximum switched-off time has elapsed;

first identifying an overcurrent if, successively, a disconnection is effected when the minimum switched-on time has elapsed after the charging current has reached or exceeded an envelope of maximum values of the charging current and then a connection is once more effected when the maximum switched-off time has elapsed without the minimum current value having been reached; and identifying an overcurrent due to a fault when:

a disconnection is effected when the minimum switched-on time has elapsed and the charging current has previously reached or exceeded the envelope of maximum values of the charging current; or after a disconnection due to the envelope of maximum values of the charging current having been reached, a connection is once more effected when the maximum switched-off time has elapsed but the minimum current value had not been reached.

2. The method according to claim 1, which comprises determining a fault when an overcurrent has been identified for a prescribed number of cycles.

3. The method according to claim 2, which comprises increasing a value of a fault counter reading each time an overcurrent is identified and identifying a fault when the counter reading reaches a prescribed value.

* * * * *